(12) United States Patent
Mouser

(10) Patent No.: US 12,259,447 B2
(45) Date of Patent: Mar. 25, 2025

(54) MAGNETIC PERMEABILITY MAPPING SYSTEM AND METHOD

(71) Applicant: MOUSER LABS, LLC, Overland Park, KS (US)

(72) Inventor: Craig Mouser, Overland Park, KS (US)

( * ) Notice: Subject to any disclaimer, the term of this patent is extended or adjusted under 35 U.S.C. 154(b) by 0 days.

(21) Appl. No.: 18/093,507

(22) Filed: Jan. 5, 2023

(65) Prior Publication Data

US 2024/0230799 A1    Jul. 11, 2024

(51) Int. Cl.
  *G01R 33/12*    (2006.01)
(52) U.S. Cl.
  CPC ................................ *G01R 33/1223* (2013.01)
(58) Field of Classification Search
  CPC .............................. G01R 33/00; G01R 33/1223
  See application file for complete search history.

(56) References Cited

U.S. PATENT DOCUMENTS

| | | | | |
|---|---|---|---|---|
| 3,633,184 A * | 1/1972 | Harding | ............ | G11C 11/06064 |
| | | | | 365/243 |
| 5,510,711 A * | 4/1996 | Molyneaux | ........ | G01R 33/3678 |
| | | | | 324/309 |
| 2015/0015247 A1 * | 1/2015 | Goodwill | ........... | G01R 33/1276 |
| | | | | 324/244 |
| 2016/0084924 A1 * | 3/2016 | Osumi | ............... | G01R 33/1223 |
| | | | | 324/236 |
| 2016/0178710 A1 * | 6/2016 | Fidler | .................. | A61B 5/0515 |
| | | | | 324/239 |

* cited by examiner

*Primary Examiner* — Jermele M Hollington
*Assistant Examiner* — Taqi R Nasir
(74) *Attorney, Agent, or Firm* — Arthur Shaffer; MCDOWELL RICE SMITH & BUCHANAN, P.C.

(57) ABSTRACT

The present invention is a ferrobody magnetic permeability mapping system including a ferrobody material, a first magnetic generator, a second magnetic generator in electrical communication with the first magnetic generator and configured to present an alternating magnetic field, a control circuit configured for alternating operation of the first and second magnetic generators; the magnetic permeability sensor being configured for measuring the magnetic permeability of the ferrobody material in response to the alternating magnetic field; the magnetic permeability sensor including a matrix comprising at least one row select circuitry and at least one column select circuitry wherein the magnetic permeability of the ferrobody material is obtained by the row select circuitry and the column select circuitry where magnetic permeability values of the ferrobody material is obtained at multiple locations within the alternating magnetic field.

5 Claims, 6 Drawing Sheets

MAGNETIC PERMEABILITY MAPPING SYSTEM AND METHOD

FIELD OF THE INVENTION

The present invention relates to an apparatus and method for determining the position and orientation of an object by means of magnetic fields and includes apparatus and methods for measuring the magnetic permeability of a magnetic permeability body by means of a magnetic field generator using a plurality of magnetic sensor arrays.

BACKGROUND OF THE INVENTION

Various methods have been utilized for determining the position, status and orientation of an object in space. One example, is to determine the position and orientation of a medical instrument within the body of a patient as, for example, to monitor the position and orientation of a catheter, endoscope or other probe. Another method is to conduct nondestructive quality testing for goods during the manufacturing process. One simple method of accomplishing this is to take a direct X-ray image, such as a fluoroscopic image, showing the desired object and any internal features or characteristics. This method has the disadvantage that the entire imaging procedure to acquire an image of the patient must be repeated whenever the instrument is moved. X-ray imaging such as fluoroscopy can expose the person or object to unwanted ionizing radiation. Some types of imaging procedures, such as MRI imaging also cannot be repeated during surgical procedures.

An alternative for locating articles both inside and outside of the human body involves the use of magnetic fields. Many include medical related systems, some include military and industrial applications. Many of these systems for determining the position and orientation of objects in three-dimensional space use magnetic coils on the object to be located and stationary coils in a fixed frame of reference. Some others use a magnetic field transmitter incorporating several coils wound on orthogonal axes about an iron core, and a similar structure used as a receiver. The coils of the transmitter are actuated in sequence and/or at different frequencies, and the signals detected by the coils of the receiver are analyzed to determine the position and orientation of the transmitter relative to the receiver.

Some of these systems use an AC signal which can induce a current into the body to be measured, which can result in eddy currents, generating a secondary AC magnetic field that distorts the field and renders measurement difficult. While there are different methods which can be utilized for compensation of the secondary currents, many of these are time consuming and expensive to perform and only work in environments where they have limited impact and limited conductive material near the transmitter or receiver units. In some cases, the secondary currents become too large and limit the detectability of the underlying signal or if detected, the usability of the measured data. In addition, some of the systems using a single sensor which react to high-temperature or contaminated conditions, cause the sensor to become unreactive or unresponsive. In addition, some sensors have a limited sensory region making it hard to discern minute changes or fluctuations and if detection if made, it involves significant time and computing resources.

In some cases, it would be desirable to determine the distribution or measure the magnetic flux density in a fast manner using for example sampling of data for changes or variations from a baseline measurement.

Based in part on the foregoing challenges, there exists a need for a system and method for mapping a magnetic permeability body based on an array of magnetic permeability sensors configured to create an overlapping sensory region.

SUMMARY OF THE INVENTION

The need for the present invention is met, to a great extent, by the present invention wherein in one aspect a magnetic permeability permeability mapping system and method is provided that in some embodiments will generate a representation of the magnetic permeability body within an alternating magnetic field based on the sensory data generated by an array of magnetic permeability sensors. The magnetic permeability permeability mapping system generally includes a pair of magnetic generators with an array of magnetic permeability sensors for sensing the magnetic permeability throughout a computer generated magnetic field in operable communication with the pair of magnetic generators and upon processing the sensor data.

In one embodiment, the ferrobody magnetic permeability mapping system comprises a ferrobody material; a first magnetic field generator; a second magnetic field generator in electrical communication with said first magnetic field generator; a circuit controller in operational communication with each of said first and said second magnetic field generators whereby each of said first and said second magnetic field generators generate a magnetic field; a sensor array in communication with a processor and further comprising at least a first sensor element in electrical communication with a second sensor element; said sensory array providing sensor data associated with the magnetic permeability of said ferrobody material; said first sensor element associated with a first position; said second sensor element associated with a second position spaced from said first position whereby said sensory array provides sensor data associated with the magnetic permeability at each of said first and said second position; said sensor array comprising at least one row select circuitry wherein said sensor data includes positional data associated with each of said first position and said second position; a processor for processing said sensor data obtained from said row select circuitry associated with said ferrobody material.

In an alternative embodiment of the present invention, a first magnetic generator, a second magnetic generator in electrical communication with a control circuit configured for alternating operation of the first and second magnetic generators. The array of magnetic permeability sensors is provided for detecting the magnetic field generated by the first and second magnetic generator at a plurality of measured locations. The magnetic permeability sensory array is configured for measuring an initial magnetic permeability value at multiple locations. Upon receipt of the magnetic permeability body, the magnetic permeability sensor array obtains a second magnetic permeability measurement. Once the desired sensor data has been obtained, the sensor data is transmitted to a computer controlled processor configured for receiving sensor data. The magnetic permeability of the magnetic permeability body is determined by processing the received sensor data and comparing it to the initial magnetic permeability sensor data at specific locations. Upon processing the sensor data into permeability data, the data may be used to generate a permeability map of the magnetic permeability body.

An exemplary process for determining the magnetic permeability of a ferrobody material said process comprising the steps of positioning at least a first magnetic field generator and a second magnetic field generator in electrical communication with a circuit controller; positioning a sensor array with at least a first sensor element and a second sensor element opposite said first and second magnetic field generator; activation of said first magnetic field generator and said second magnetic field generator to obtain threshold data from said sensory array; positioning said ferrobody material between said first and said second magnetic field generator; activation of said first magnetic field generator and said second magnetic field generator to obtain ferrobody sensor data from said sensory array; and determining the magnetic permeability of said ferrobody material by processing said threshold sensor data and ferrobody sensory data at a processor.

Certain embodiments of the invention are outlined above in order that the detailed description thereof may be better understood, and in order that the present contributes to the art may be better appreciated. There are, of course, additional embodiments of the invention that will be described below and which will form the subject matter of any claims appended hereto.

In this respect, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein as well as the abstract are for the purposes of description and should not be regarded as limiting.

As such, those skilled in the relevant art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention. Though some features of the invention may be claimed in dependency, each feature has merit when used independently.

Various objects and advantages of the present invention will become apparent from the following description taken in conjunction with the accompanying drawings wherein are set forth, by way of illustration and example, certain embodiments of this invention. The drawings submitted herewith constitute a part of this specification, include exemplary embodiments of the present invention, and illustrate various objects and features thereof.

BRIEF DESCRIPTION OF THE DRAWINGS

Further features of the present invention will become apparent to those skilled in the art to which the present invention relates from reading the following description with reference to the accompanying drawings, in which a better understanding of the present invention is depicted, in which.

DETAILED DESCRIPTION OF THE INVENTION

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Figure 1:
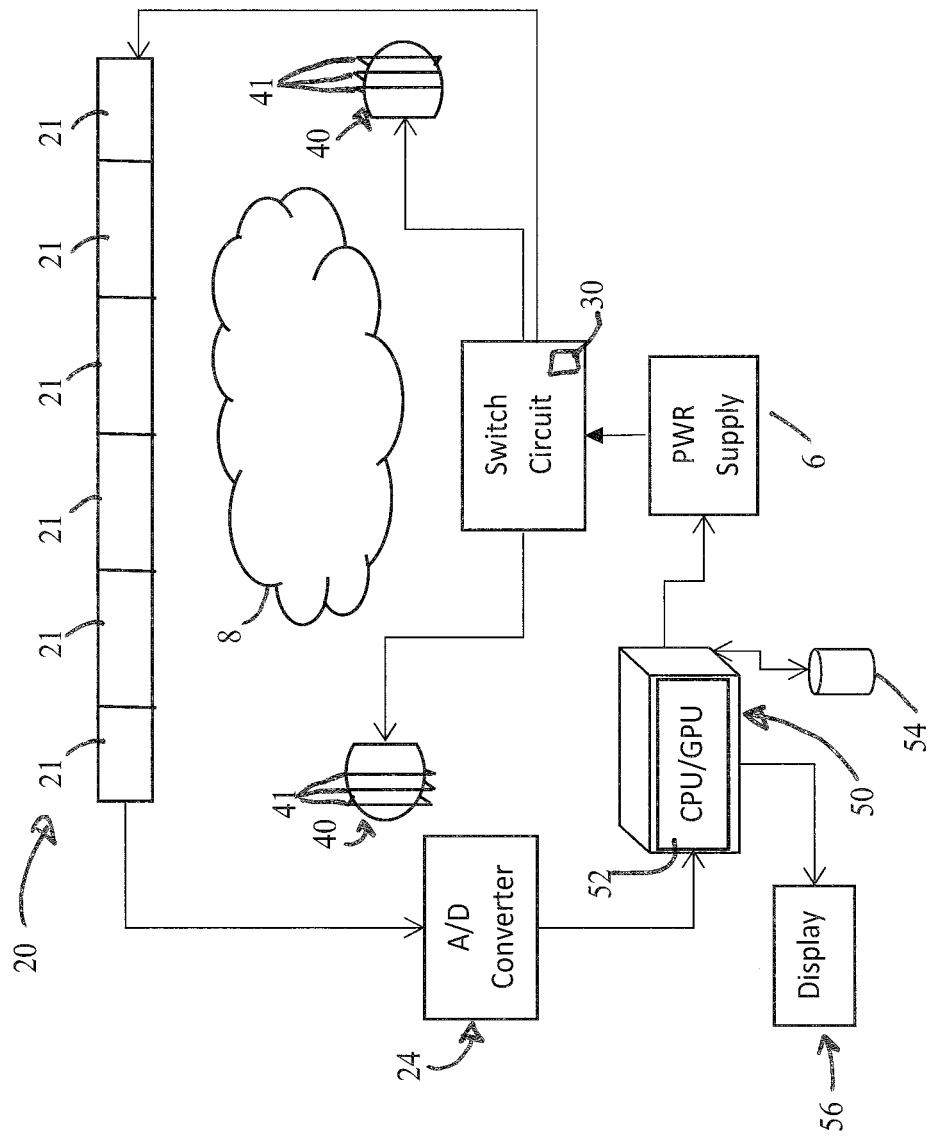
FIG. 1 is a system block diagram view of an exemplary embodiment of the magnetic permeability mapping system.

Accordingly, the above problems and difficulties are obviated, at least in part, by the present magnetic permeability mapping system and method 10 which provides a system and method for mapping a magnetic permeability object 8 also referred to herein as ferrobody. FIG. 1 represent a systematic diagram of the magnetic permeability mapping system 10 which includes a power source 6 in electric communication with a sensor array 20 which includes individual sensor elements 21 and a circuit controller 30 which is in operational communication with at least one and as depicted a pair of magnetic field generators 40. The sensor array 20 is positioned near the magnetic permeability object 8 and is in communication with the processor 52 with sufficient operating characteristics for receiving data from the sensor array 20 through an analog to digital converter 24 for storage by a data storage repository 54 in communication with a computer 50. As illustrated in FIG. 1, although the magnetic field generators 40 are illustrated as separate components and separated from both the sensory array 20 and switching circuit controller 30 they can be operationally combined as desired.

Figure 2:
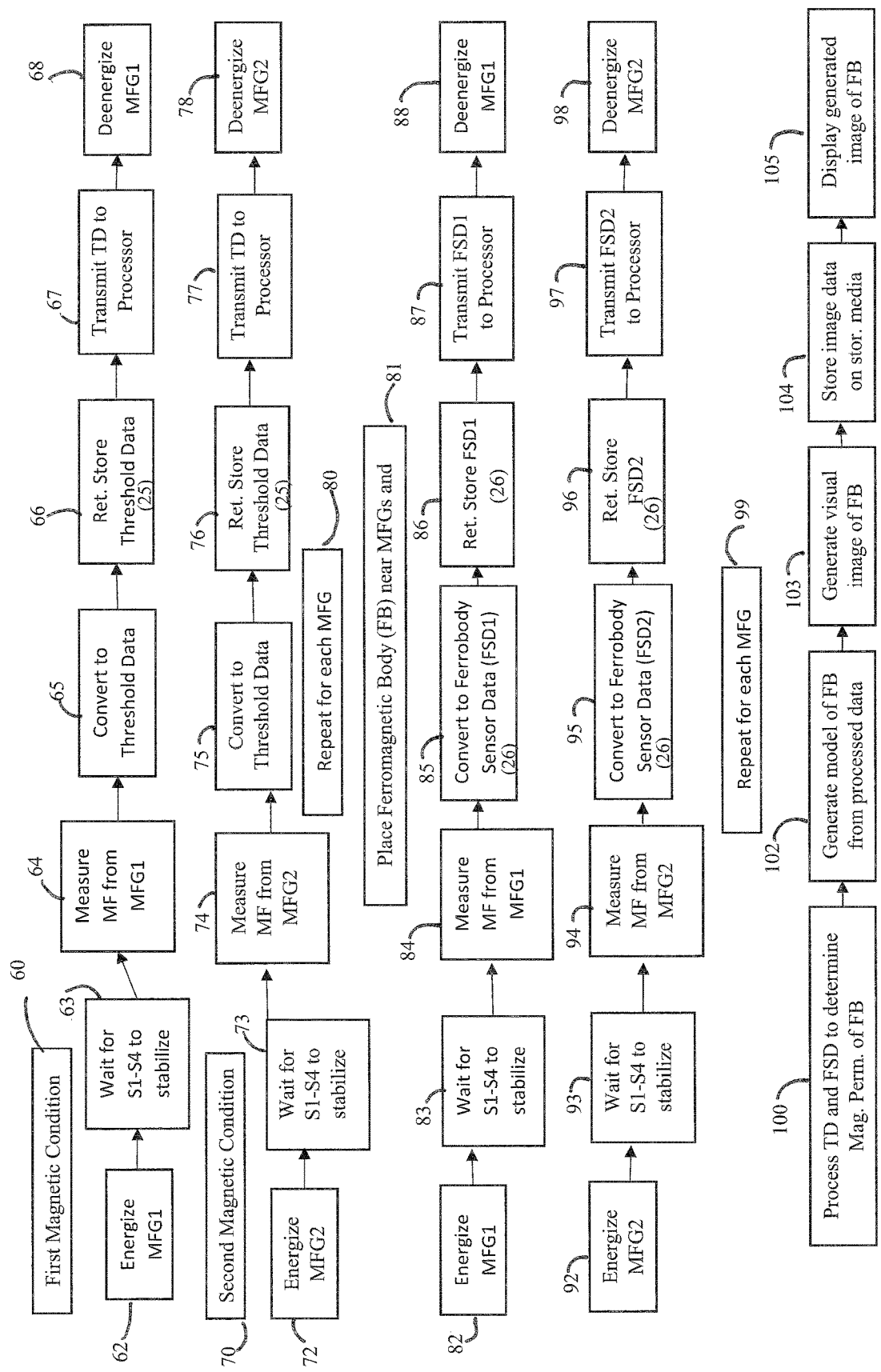
FIG. 2 block diagram of an embodiment of an operational method for the operating the magnetic permeability mapping system.

In order to obtain a reliable reading, the magnetic permeability of the system 10 must be accounted for and deducted from the measurement of the magnetic permeability material 8. In an exemplary method of operation as depicted in FIG. 2, at steps 60 and 70 a base level reading is obtained for each of the magnetic field generators 40 after they are energized 62, 72. In energizing the first magnetic field generator 40, a first magnetic condition 60 is obtained. In energizing the second magnetic field generator 40 a second magnetic condition 70 is obtained. The first magnetic condition 60 is generally associated with the first magnetic field generator and the second magnetic condition 70 is generally associated with the second magnetic field generator 40. Upon energizing each magnetic field generator 40, a base level, baseline or threshold measurement of the system 10 and surrounding environment is obtained which may be associated with the magnetic permeability mapping system 10 independent of any magnetic permeability material 8.

In the exemplary operational embodiment depicted in FIG. 2, the first magnetic field generator 40 is energized at step 62, and the second magnetic field generator is energized at step 72. After energizing the magnetic field generators 40, the system 10 waits a time interval for the sensors (depicted as S1-S4 but may be more or less as desired) to stabilize at steps 63, 73. After stabilization, a reading of the sensors S1-S4 at steps 64, 74 is obtained and the sensor data is then converted to threshold data 25 using the A/D converter 24, for example, at steps 65, 75. The threshold data 25 is then retrievably stored at steps 66, 76 using for example the data repository 54. The threshold data 25 may then be transmitted to the processor 52 at steps 67, 77 and then the magnetic field generator 40 may be deenergized as indicated at steps 68, 78. This exemplary process is repeated for each magnetic field generator field generators 40 as indicated at step 80. As depicted in FIG. 2, two magnetic field generators 40 are utilized, another embodiment of the system 10 illustrated in FIG. 3, includes four magnetic field generators 40. The system 10 may use more or less depending on the desired sensory data 23 and magnetic permeability material 8. Generally, the base-level or threshold sensor data provides information about surrounding or ambient conditions which may impact the sensor readings from the sensor array 20.

After the threshold data 25 is determined, in the exemplary method of operation depicted in FIG. 2, the magnetic permeable material 8 is measured by placing it near the system at step 81. After placing the magnetic permeable material 8 near the magnetic field generators 40, a similar operational process as described above is utilized: for each magnetic field generator 40 (step 99), each magnetic field generator is energized at steps 82, and the second magnetic field generator is energized at step 92. After energizing the magnetic field generators 40, the system 10 waits a time interval for the sensors (depicted as S1-S4 but may be more or less as desired) to stabilize at steps 83, 93. After stabilization, a reading of the sensors S1-S4 at steps 84, 94 is obtained and the sensor data is then converted to ferrobody sensor data 26 using the A/D converter 24, for example, at steps 85, 95. The ferrobody sensor data 26 is then retrievably stored at steps 86, 96 using for example the data repository 54. The ferrobody sensor data 26 may then be transmitted to the processor 52 at steps 87, 97 and then the magnetic field generator 40 may be deenergized as indicated at steps 88, 98. As indicated at step 99, this process may be completed for each magnetic field generator 40.

The ferrobody sensor data 26 and threshold data 25 are different sets of sensor data 23. Like sensor data 23 and threshold data 25, ferrobody sensor data 26 may be obtained from the sensor array 20 as separate data and combined using the processor 52 or computer 50 or processors or computers (not shown) or obtained as a combination of sensor data with multiple magnetic field generators 40 energized or a combination of combinations as desired. As indicated in step 100, the system 10 processes the threshold data 25 and ferrobody sensor data 26 to determine the magnetic permeability of the ferrobody 8. Based on the processed data and magnetic permeability determination, the system 10 may then generate a model of the ferrobody at step 102. Using the generated ferrobody model, the system 10 may then generate a visual representation of the ferrobody as indicated at step 103, storing the data associated with the ferrobody model and/or the visual representation of the ferrobody model as further indicated at step 104. The visual representation of the ferrobody may be displayed, as indicated in step 105 using, for example, a display 56. By way of example, the system may use ASTM A342/A342M There are many methods of testing magnetic properties available on the market and they are defined by a set of standards issued by standardization and standardization organizations, such as the International Electrotechnical Commission (IEC), the American Association for Testing and Materials (ASTM) and the European Committee for Electrotechnical Standardization (CENELEC). These organizations have prepared a number of publications for test standards under 60404 (IEC TC 85), ASTM A342, ASTM STP371S1, ASTM A596-95e1. The CENELEC standardization committee provides its standardization in the CLC/SR 85 regulation (Measuring Equipment for Electrical and Electromagnetic Quantities) including EN 60359: 202, EN 61028: 1993, EN 61143-2: 1994, EN 61187: 1994 and EN 61554.

In general, system 10 generates a magnetic field 600 using a plurality of magnetic field generators 40 which in the depicted embodiment have a convergent alignment with co-facing positive bores. In an exemplary embodiment, the magnetic field generators 40 may include an external coil 41 which is in electrical communication with the circuit controller 30. By controlling the energizing of the coils 41 associated with each magnetic field generator 40, a 3-dimensionally meshed magnetic field 600 is generated which generally produces a blended magnetic field. In general, each magnetic field generator 40 includes at least one coil 41 or other field generating elements having a charged surface to contribute to the shape of the generated magnetic field 600.

Upon generation of the magnetic potential throughout the system 10, the sensor array 20 is utilized to measure and transmit sensor data through the processor 52 for retrievable storage as desired by the processor 52. Using the base-level sensor data, subsequent readings can be obtained and the ambient condition subtracted or removed from consideration. Generating the first magnetic condition provides a base excitation level as measured by the sensor array 20. The base level sensor data may be obtained by powering the magnetic field generators through the controller and sensors to determine the sensor characteristics as a function of the applied magnetic field to the sensor array which results from powering the circuit controller 30 without the received magnetic permeability body. If desired, the system components can be placed within a magnetically shielded housing to help limit any magnetic noise from the ambient environment.

In an exemplary operational embodiment, upon activation from a power supply, the magnetic permeability mapping system 10 is initialized and the circuit controller 30 receives the desired power supply. Based upon the electrical communication between the controller and the processor, the controller transmits the electrical signal to the magnetic field generator. Upon energizing the circuit controller 30, the magnetic field generators 40 are selectively energized. In one embodiment, the initialization occurs a period of time after powered activation of the system 10 in order to allow the generated magnetic field to become stable, allowing the sensor array for obtain accurate and/or precise readings.

The sensory array 20 measures various properties of the generated magnetic field and converts the measured properties into sensor data which is transmitted to the processor 52 from the AD converter 24 and then to the data repository 54 for retrievable storage. Generating a second magnetic condition causes the sensor array 20 to generate sensor data which is then transmitted to the processor 52, from the AD converter 24 to the data repository 54. The sensor data corresponding to the first magnetic condition is then removed from the sensor data associated with the second magnetic condition and the first reading is processed and displayed as desired on any display device.

Upon measurement of an initial or first magnetic condition, the sensory array 20 provides a first measurement reading. A second or subsequent magnetic condition may be measured by the sensory array 20 upon positioning the magnetic permeability material 8 in approximation to the sensor array 20. This second or subsequent measurement represents a second excitation level. For example, upon receipt of a magnetic permeability material 8, the sensor data from the sensor array 20 may represent an increased the signal-to-noise ratio (SNR) of the magnetic signal detected by the sensory array 20. The measurement may be linear and may include a reduction or increase associated with the measurement of the magnetic permeability material 8 by the system 10. By increasing the SNR, sensor array 20 measures the magnetic permeability of the ferrobody material 8.

The target area is generally disposed between the pair of magnetic field generators 40. Depending on the orientation of the magnetic field generators 40, the area of convergence may be described as a 3-dimensional (3D) field of magnetic potential directed towards a central region surrounding the area configured for receiving the magnetic permeability body 8 presented with a flux density which can be computed based on the sum of magnetic flux data from at least one sensor array 20 positioned around the generated magnetic field 600.

Figure 3:
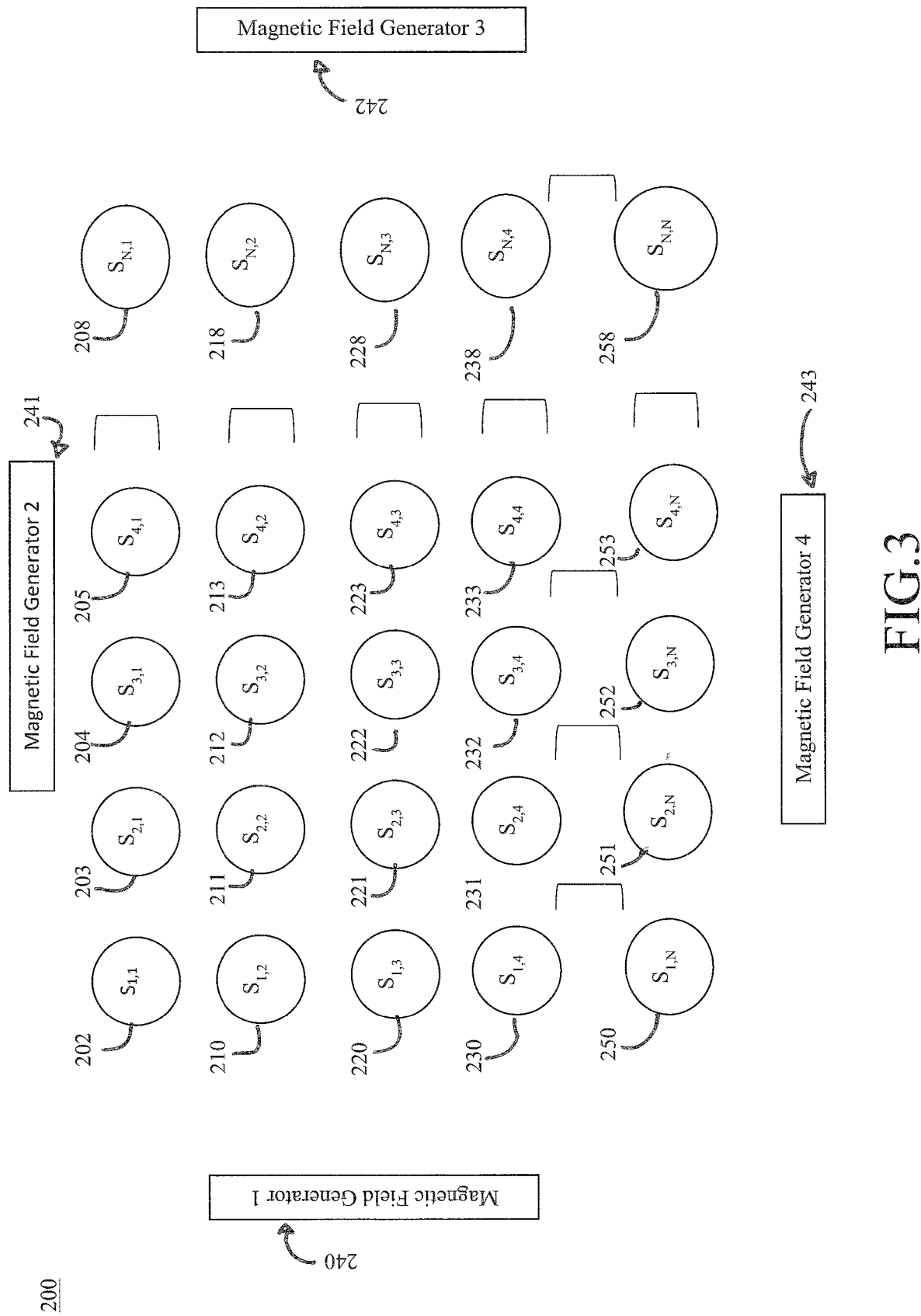
FIG. 3 is an array of permeability sensors with a plurality of sensor circuits arranged in an N×N array.
Figure 6:
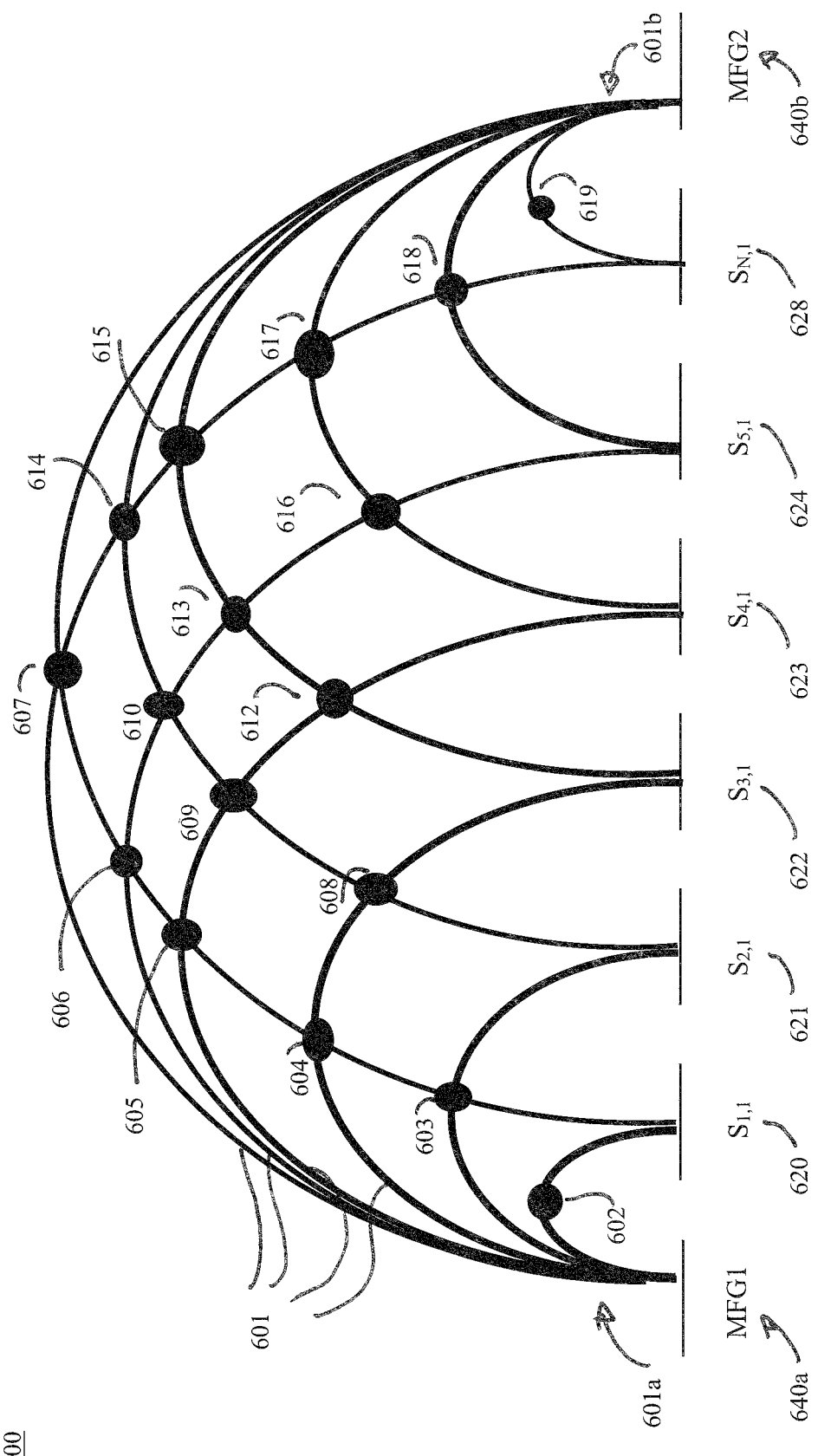
FIG. 6 is a 2-dimensional flux diagram showing representative intersecting flux lines generated by a pair of magnetic field generators within an exemplary sensor area with an array of n-sensors.

In one embodiment of the present system 10 depicted in FIG. 1, there is provided at least one magnetic flux generator 40 and a pair of sensor arrays 20 for sensing the magnetic flux surrounding the received magnetic permeability body or object 8. The magnetic permeability or flux density is generally defined by the formula of B=$\mu$·H where B=$\mu$0·(H+M) and $\mu$=$\mu$0·(1+K). In this embodiment, the magnetic flux generator 40 produces a magnetic field having a flux density which varies based on the characteristics of the received magnetic permeability body 8. The magnetic field 600 is generated within a desired target area which can vary based on the magnetic generating characteristics of the magnetic flux generator 40 and the switched circuit controller 30. In one exemplary embodiment, the magnetic field 600 may form the shape of a toroidal with a divergence at circular coordinates which presents a divergence ring as further illustrated in FIG. 6. The magnetic potential then propagates back towards the magnetic generators 640. In one embodiment, the magnetic field potentials at the base level system are shaped to present a constant value at relevant locations so that they will present limited angularity when viewed from an axial reference. Upon initial application of the magnetic field 600, a eddy current may develop whose direction is opposite to that of the applied current. The current flow has both an effect in DC and AC and should be taken into account when setup the magnetic field. The initial application of the magnetic field 600 may depend on the specific geometry of the object being measured and according to the metallurgical properties of the object and time dependent and the time to normalize the field induction By way of example, the magnetic field depicted in FIG. 6 by reference number 600 is measured inductively by the sensory array 20. An exemplary embodiment of a representative sensor array 20 is illustrated in FIG. 3 with an N×N sensory array 20. As further depicted n FIG. 6, the magnetic field 600 is measured by the sensor array 20 at various locations from one of the magnetic field generators 640 which may correspond to the space around the magnetic permeability body 8. FIG. 6 includes the induced magnetic flux lines 601 are illustrated extending radially from the magnetic field generators (MFG1 and MFG2) 640. The flux lines 601 generally extending from each magnetic field generator 640 in parallel arcs over the target area. The presence of a magnetic permeability body 8 can affect the illustrated magnetic field represented by the illustrated flux lines 600, generally reducing the magnitude of the magnetic field based on the ferromagnetic properties of the received body 8. The intersections of the magnetic field flux at certain locations is represented by the reference numbers 603 through 619 with various sensors corresponding to sensors S1,1 through SN,1 depicted by reference numbers 620 through 628.

The sensor array 20 converts the detected magnetic field 600 into sensor data such as threshold data 25 and ferrobody sensor data 26 which generally corresponds to the flux density readings at the corresponding sensor positions associated with the spatial relationship of the sensory array 20 to the magnetic field generator 640 and the magnetic permeability body 8. The magnetic field generator 640 generates and transmits sufficient magnetic flux through the target area which is sensed by the sensory array 20.

In general, the sensor array 20 is formed in a semiconductor substrate and is responsive to magnetic flux produced by the magnetic generator 40. The sensory array is used to calculate the relative permeability of the material sample from the measured Hall sensor values in the air gap. A simulation of the numeric 3D model is achieved by comparing the magnetic circuit and the numerical analysis on the received sensor data. By way of example, the sensor array 20 may be of type HE144, KSY14 and KSY44 Hall Sensors designed to produce a corresponding voltage in response to a perceived magnetic field. An example of the sensor array 200 is depicted in FIG. 3 in relation to a plurality of magnetic field generators, first, second, third and fourth generators 240, 241, 242, 243. The sensor array 200 may be arranged into various rows and columns to produce a changing current or voltage based on the impact of the magnetic permeability body 8. The sensor array 200 may be positioned on a planar substrate with various magnetic circuitry grouped and spaced along the sensor array 200 into various rows and columns. Of course, other components may or may not be positioned along the planar substrate which, as depicted, extends from a first position associated with sensor $S_{1,1}$ at 202 associated with row 1 and column 1 to sensor $S_{N,N}$ at 258 associated with row N and column N. Each of the sensors associated with reference numbers 202 through 258 correspond to spaced apart Hall Effect sensors which are configured to sense the magnetic field generated by the magnetic field generators 1-4 associated with reference number 240, 241, 242 and 243 where sensor data 23 corresponds to the output of sensor array 200. In the depicted embodiment, the sensor array 200 is comprised of individual sensor circuitry arranged into various rows and columns. By way of example, the sensor array depicted in FIG. 3 includes sensor elements $S_{1,1}$ 202 associated with the first row, first column, $S_{2,1}$ 203 associated with the first row, second column, $S_{3,1}$ 204 associated with the first row, third column, $S_{4,1}$ 205 associated with the first row, fourth column, through the Nth column associated with $S_{N,1}$ 208 which comprise the first row in the sensor array 200. Sensor elements $S_{1,2}$ 210 associated with the second row, first column, $S_{2,2}$ 211 associated with the second row, second column, $S_{3,2}$ 212 associated with the second row, third column, $S_{4,2}$ 213 associated with the second row, fourth column, through the Nth column associated with $S_{N,2}$ 218 which comprise the second row in the sensor array 200. Sensor elements $S_{1,3}$ 220 associated with the third row, first column, $S_{2,3}$ 221 associated with the third row, second column, $S_{3,3}$ 222 associated with the third row, third column, $S_{4,3}$ 223 associated with the third row, fourth column, through the Nth column associated with $S_{N,3}$ 228 comprise the third row in the exemplary depicted sensor array 200 in FIG. 3. $S_{1,4}$ 230 associated with the fourth row, first column, $S_{2,4}$ 231 associated with the fourth row, second column, $S_{3,4}$ 232 associated with the fourth row, third column, $S_{4,4}$ 233 associated with the fourth row, fourth column, through the Nth column associated with $S_{N,4}$ 238 comprise the fourth row in the exemplary sensor array 200 depicted in FIG. 3. Sensor elements $S_{1,N}$ 250 is associated with the Nth row first column, $S_{2,N}$ 251 is associated with the Nth row, second column, $S_{3,N}$ 252 is associated with the Nth row, third column, $S_{4,N}$ 253 is associated with the Nth row, fourth column, through the Nth column associated with $S_{N,N}$ 258 comprise the Nth row which may represent any additional rows which may be used in the exemplary sensor array 200 from the fourth array to some later row where N represents the ending row which is utilized and is covered by the embodiment depicted in FIG. 3. Each circuit output from each of the sensory components will vary based upon the physical location of the sensor component in relation to each of the magnetic field generators 240, 241, 242, 243 and the intervening magnetic permeable body 8 which is not shown in FIG. 3. In general, the magnetic permeable body 8 absorbs some amount of the magnetic field 600 generated by the magnetic field generators 240, 241, 242, 243. Each sensor element responds to the received magnetic field and may produce a differential output voltage or current, for example in response to the received magnetic field 600. Of course, other techniques may be used to sense the magnetic field from the spaced apart magnetic sensor elements.

As will be appreciated by those skilled in the art, using a plurality of magnetic field sensor elements is beneficial. By using a pair, grouping or array with more than one magnetic field sensor element will allow for measurement of the magnetic field along a plurality of axes, e.g., x-axis and y-axis within the target area. As depicted by the exemplary sensor array 200, the sensor array may utilize a variety of spaced apart magnetic field sensor elements 202 through 258 within the sensor array 200. For example, using four spaced apart magnetic field sensor elements 202 through 205 may permit measurement of the magnetic field along the x-axis. Using more spaced apart magnetic sensor elements, with additional magnetic field generators 240, 241, 242, 243 will increase the accuracy of the measurement.

Figure 4:
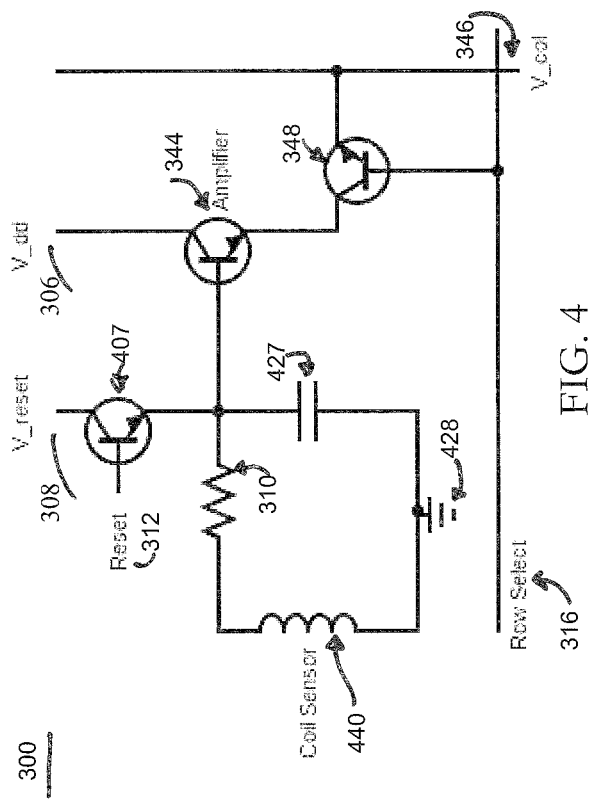
FIG. 4 is an exemplary circuit diagram of an embodiment of a sensor circuit represented by the letter "S" in FIG. 3 and the "S" in FIG. 5.

In the depicted embodiment of FIG. 4, an exemplary magnetic circuit 300. By way of example, the magnetic circuit 300 depicted in FIG. 4 may correspond to one of the sensor elements arranged into a variety of rows and columns illustrated in FIG. 3. The functional circuitry components including an exemplary voltage reset transistor 407, amplifier transistor 344 and a row select transistor 348, a coil sensor 440, a resistor 310 and a capacitor 427 which includes a reset supply voltage (Vres) 308 and a supply voltage (V_dd) 306 a row select output 316 and a Vcol 346. It will be appreciated by one skilled in the art can be accomplished with various commercially available, chips, circuits and circuitry components. In the exemplary circuit 300 the coil sensor 440 is separated from the output of the voltage reset transistor 407 by the resistor 310, with one end of the coil sensor 440 tied to the ground connection 428. The capacitor 427 is connected between the leg of the amplifier transistor 342 and the output conductor 342. Generally, the exemplary magnetic circuit 300 senses the magnetic flux corresponding to the associated magnetic field generators with a sensory element represented by the magnetic circuit 300. The magnetic circuit 300 is electrically connected to a power source 306 or they may be connected to each other with a common power source available to the grouping or array of magnetic circuits 300. In addition, the magnetic circuit 300 depicted in FIG. 4 is configured to allow for transmission of sensor data 23 which may be, for example, connected to a processor 52 or a switched circuit controller 30 which may be used to receive sensor data 23 and to determine a dimensional position. Additionally, the magnetic circuit 300 may be configured to measure the intensity of the magnetic field (e.g. flux density) at its location which is generated by the magnetic field generators 440. The coil sensors 440 depicted in FIG. 4 may correspond to magnetic field sensors, fixed in relative positions to the magnetic field generators 40. In this arrangement the magnetic field sensors represented by the exemplary magnetic circuit 300 allow for measurement of the magnetic permeability body 8 placed between the magnetic field generators 40 and the sensor array 20.

FIG. 4 shows a circuit schematic of a single sensory element associated with the sensor array 200. As depicted, the magnetic circuit 300 includes active elements such as capacitor 427 in parallel with the coil sensor 440. The coil sensor 440 operationally generates a current in the changing magnetic field proportional to the amplitude of the field 600. The coil sensor 440 will be connected to resistor 310 and capacitor 427 to create an LRC circuit with values which can be tuned or aligned with the resonant frequency with the magnetic field generators 40. In general, the output of the circuit 300 is linked to a reset voltage through transistor switch 407. When the transistor switch 407 is enabled, it will bring the output to a constant voltage to enable consistent measurements. When disabled the transistor switch 407 will act as an open circuit and will not affect the output. The output value of the circuit 300 will be proportional to the amplitude of the magnetic field 600, but may be relatively small. Amplifier transistor 344, illustrated as being operationally connected to the row selector transistor switch 348 will bias the output for receipt onto the column bus 346.

The magnetic circuit 300, generally operates as a tank circuit when the capacitor 427 and coil sensor 440 are generally equivalent. The magnetic circuit 300 is grounded at one side and at the opposite side, a voltage reset transistor 312. The coil sensor 440 generates a current when placed within magnetic field 600 generated from the plurality of magnetic field generators 40. Generally, the generated current is proportional to the amplitude of the magnetic field 600. By altering the coil sensor 440 or resistor 310 the magnetic circuit 300 can be tuned and aligned to the magnetic field generators 40.

In the embodiment of the magnetic circuit 300 illustrated in FIG. 4, a plurality of transistors including a voltage reset transistor 407, amplifier transistor 344, row select transistor 348 are operationally connected to the magnetic circuit 300. The magnetic circuit 300 provides a magnetic flux sensor signal on output conductor 342. The magnetic flux sensor signal at output conductor 342 is read out at amplifier transistor 344 onto a column bus 346 (Vcol) when a row select transistor 348 is activated. A reset transistor 407 operates to reset the magnetic circuit 300 from an open state to a known state.

For example, using the illustrative sensor array 200 depicted in FIG. 3, each sensor elements $S_{1,1}$ 202, $S_{2,1}$ 203, $S_{3,1}$ 204, $S_{4,1}$ 205, $S_{N,1}$ 208, on the first row $S_{1,2}$ 210, $S_{2,2}$ 211, $S_{3,2}$ 212, $S_{4,2}$ 213, $S_{N,2}$ 218, on the second row $S_{1,3}$ 220, $S_{2,3}$ 221, $S_{3,3}$ 222, $S_{4,3}$ 223, $S_{N,3}$ 228, on the third row, $S_{1,4}$ 230, $S_{2,4}$ 231, $S_{3,4}$ 232, $S_{4,4}$ 233, $S_{N,4}$ 238, on the fourth row $S_{1,N}$ 250, $S_{2,N}$ 251, $S_{3,N}$ 252, $S_{4,N}$ 253, $S_{N,N}$ 258 on the Nth row would share a common row select 316. For each sensor element arranged in a shared column $S_{1,1}$ 202, $S_{1,2}$ 210, $S_{1,3}$ 220, $S_{1,4}$ 230, $S_{1,N}$ 250 on the first column, $S_{2,1}$ 203, $S_{2,2}$ 211, $S_{2,3}$ 221, $S_{2,4}$ 231, $S_{2,N}$ 251 on the second column, $S_{3,1}$ 204, $S_{3,2}$ 212, $S_{3,3}$ 222, $S_{3,4}$ 232, $S_{3,N}$ 252 on the third column, $S_{4,1}$ 205, $S_{4,2}$ 213, $S_{4,3}$ 223, $S_{4,4}$ 233, $S_{4,N}$ 253 on the fourth column, $S_{N,1}$ 208, $S_{N,2}$ 218, $S_{N,3}$ 228, $S_{N,4}$ 238, $S_{N,N}$ 258 on the Nth column would share a common Vcol 346 for selectively designating the corresponding senor data 25 in response to the magnetic flux sensed by at least one magnetic circuit 300. For each column in the sensory array 200 there is corresponding column select circuitry connected to each of the magnetic circuit structures designating for outputting sensory data 23 which corresponds to the magnetic flux sensed by the corresponding sensory element.

One end of the magnetic circuit 300 is operationally connected to the voltage reset transistor 407 is operationally connected to the reset voltage (Vreset) 308. Another end of the output of the magnetic circuit 300 is operationally connected to an amplifier transistor 344 which is in communication with the row select bus 316 which when operationally biased allows for transmission of the output of the sensor data 23 from the magnetic circuit to the (Vcol) 346. When the reset transistor 407 is enabled, the output of the magnetic circuit 300 will be biased by the reset voltage (Vreset) to allow for constant voltage to the reset transistor 407. Generally, constant voltage to the reset transistor 407 enables consistent sensor readings. When the reset transistor 407 is disabled, the magnetic circuit 300 will operate as an open circuit and will not affect the output at the output conductor 342. Generally, in a non-reset condition, the output associated with the magnetic circuit 300 at output conductor 342 will be proportional to the amplitude of the measured magnetic field.

Generally, the switched circuit controller 30, also referred to herein as a circuit controller energizes each of the magnetic field generators 40 as desired. In addition, the switch circuit controller 30 may be coupled to the sensor array 20 or the AD converter 24 which is in electrical communication with the sensor array 20. Upon receipt of sensor data 25, the switched circuit controller 30 may be configured to calculate the position of the magnetic permeability body 8 in relation to the sensor array 20 or to convert the sensor data 25 or the data from the AD converter 24 to determine the magnetic intensity as measured by the sensor array 200 or a plurality of sensor arrays 20 or across a grouping or an array of sensor arrays 200. Alternatively, the sensory array 20 may be a singular sensor element which is operationally connected to a plurality of spaced apart sensory elements to form the sensory array 20. The switched circuit controller 30 may include programmed instructions, computer program or software, which including additional processing steps or the processing steps as previously described or as illustrated in FIG. 2. Additionally, the switched circuit controller 30 may include, for example, removable storage media (not shown) or a separate or networked data repository 54 with computer readable computer instructions for performing the desired processes or calculations on the sensor data 25.

The switched circuit controller 30 may be operationally coupled to the sensor array 20 with a power amplifier (not shown) or an amplifier circuit (not shown). The switched circuit controller 30 may be a closed-loop controller, for example, and may include an amplifier or inline power supply 6, for example, which may be in the form of an integrated circuit and housed with the sensor array 20 or separated from the sensor array 20. Generally, the switched circuit controller 30 operates the magnetic field generators 40 to produce the magnetic field 600 as measured based upon the spaced apart sensor array 20. The switched circuit controller 30 can be used to control various parameters of the magnetic field generators 40 including the varied field strengths, electrical modulation including amplitudes, frequencies and wave patterns and other field generating characteristics such as timing and power characteristics of the energized magnetic field generators 40, which allows for shaping the flux density around the magnetic permeability body 8.

As illustrated in FIG. 3, in one embodiment, the amplifier 344 may be operationally connected to the output of the magnetic circuit 300. Generally, the amplifier 344 increases the magnitude of the output of the magnetic circuit 300. In one embodiment, the amplified output from the amplifier 344 may be operationally connected to a Vcol upon bias from the row select switch for communication of the amplifier output to a column bus.

As illustrated in FIG. 3, the sensor array 200 is reactive to surrounding magnetic permeability materials. The sensor array 200 is arranged as an array with a pluralities of the sensor elements being disposed in a two, three or n-dimensional array. In the embodiment illustrated in FIG. 3, the sensor array 200 is orientated in a two-dimensional (2-D) configuration in an N×N array. While the sensor array 200 depicted in FIG. 3 includes sensor elements arranged as an N×N array, additional sensor elements may be grouped together as desired and then arranged as desired. In one embodiment, the sensor elements are positioned on the side of the magnetic permeability body 8 opposite the first magnetic field generators 240, 241, 242, 243. The placement of the sensory elements on the sensory array 200 may be arranged to reflect the shape or variation in magnetic permeability properties of the magnetic permeability body 8 which is being measured and may further correspond to the dimensional parameters corresponding to the magnetic permeability body 8 being measured or as otherwise desired. The sensor elements $S_{1,1}$ 202, $S_{2,1}$ 203, $S_{3,1}$ 204, $S_{4,1}$ 205, $S_{N,1}$ 208, on the first row $S_{1,2}$ 210, $S_{2,2}$ 211, $S_{3,2}$ 212, $S_{4,2}$ 213, $S_{N,2}$ 218, on the second row $S_{1,3}$ 220, $S_{2,3}$ 221, $S_{3,3}$ 222, $S_{4,3}$ 223, $S_{N,3}$ 228, on the third row, $S_{1,4}$ 230, $S_{2,4}$ 231, $S_{3,4}$ 232, $S_{4,4}$ 233, $S_{N,4}$ 238, on the fourth row $S_{1,N}$ 250, $S_{2,N}$ 251, $S_{3,N}$ 252, $S_{4,N}$ 253, $S_{N,N}$ 258 on the Nth row elements may be arranged at predetermined distances in operational communication with the magnetic field generators 240, 241, 242, 243 for generating sensor data associated with the measurement of the ferromagnetic body 8.

The sensor elements $S_{1,1}$ 202, $S_{2,1}$ 203, $S_{3,1}$ 204, $S_{4,1}$ 205, $S_{N,1}$ 208, on the first row $S_{1,2}$ 210, $S_{2,2}$ 211, $S_{3,2}$ 212, $S_{4,2}$ 213, $S_{N,2}$ 218, on the second row $S_{1,3}$ 220, $S_{2,3}$ 221, $S_{3,3}$ 222, $S_{4,3}$ 223, $S_{N,3}$ 228, on the third row, $S_{1,4}$ 230, $S_{2,4}$ 231, $S_{3,4}$ 232, $S_{4,4}$ 233, $S_{N,4}$ 238, on the fourth row $S_{1,N}$ 250, $S_{2,N}$ 251, $S_{3,N}$ 252, $S_{4,N}$ 253, $S_{N,N}$ 258 on the Nth row are generally configured for measuring the magnetic field 600 generated by the magnetic field generators 240, 241, 242, 243. For example, each of the sensor elements $S_{1,1}$ 202, $S_{1,2}$ 203, $S_{1,3}$ 204, $S_{1,4}$ 205, $S_{N,1}$ 208, on the first row on the sensor array 200 may sense, for example, variations along a single axis of the magnetic field 600 generated by the second magnet field generators 241. By way of example, the output of the sensory elements $S_{1,1}$ 202, $S_{1,2}$ 203, $S_{1,3}$ 204, $S_{1,4}$ 205, $S_{N,1}$ 208, on the first row of the sensor array 200 may reflect the variation of the magnetic field 600 along the single axis sensed by the sensor array generating sensor data 23 including threshold data 25 and ferrobody sensor data 26, and thus in the exemplary embodiment described, the sensor(s) may be referred to as a linear or single axis sensor as further illustrated in FIG. 6.

An illustrative 2D embodiment is depicted in FIG. 6. As depicted, the pair of magnetic field generators 640*a*, 640*b* are spaced on either side of the plurality of sensor elements $S_{1,1}$ 620, $S_{2,1}$ 621, $S_{3,1}$ 622, $S_{4,1}$ 623, $S_{5,1}$ 624 and $S_{N,1}$ 628 are arranged along a row. In operation, the first magnetic field generator 640*a* will energize and generate a first magnetic field 600*a*. Each of the plurality of sensory elements $S_{1,1}$ 620, $S_{2,1}$ 621, $S_{3,1}$ 622, $S_{4,1}$ 623, $S_{5,1}$ 624 and $S_{N,1}$ 628 will measure the first magnetic field 601*a* at each position and then each sensor measurement will be converted to a digital format which corresponds to threshold signal data 25. By way of example in an operational embodiment, the threshold signal data 25 may be retrievably stored within storage media and then transmitted to the processor 52. The first magnetic field generator 640*a* will then deenergize and the second magnetic field generator 640*b* will then energize, generating a second magnetic field 601*b*. Each of the plurality of sensory elements $S_{1,1}$ 620, $S_{2,1}$ 621, $S_{3,1}$ 622, $S_{4,1}$ 623, $S_{5,1}$ 624 and $S_{N,1}$ 628 will then measure the second magnetic field 601*b* at each position and then each sensor reading will be converted to a digital format, corresponding to threshold signal data 23. That threshold signal data 23 will be stored within the storage media and then transmitted to the processor 52. The first threshold signal data will be compared to the second threshold signal data to provide a measurement of the threshold magnetic permeability reading.

After the threshold or baseline reading is obtained, the magnetic permeability body 8 will be placed near the first and second magnetic field generators 640*a*, 640*b*. The first magnetic field generator 640*a* will then be energized and generate the first magnetic field 601*a*. Each of the plurality of sensory elements $S_{1,1}$ 620, $S_{2,1}$ 621, $S_{3,1}$ 622, $S_{4,1}$ 623, $S_{5,1}$ 624 and $S_{N,1}$ 628 will measure the first magnetic field 601*a* in association with the magnetic permeable body 8 at each sensory elements $S_{1,1}$ 620, $S_{2,1}$ 621, $S_{3,1}$ 622, $S_{4,1}$ 623, $S_{5,1}$ 624 and $S_{N,1}$ 628 and then each sensor measurement will be converted to a digital format which corresponds to a first obstructed signal data. The first reading will correspond to the ferrobody sensor data 26 which in one embodiment, will be stored within storage media and then transmitted to the processor 52. The first magnetic field generator 640*a* will then deenergize and the second magnetic field generator 640*b* will then energize, generating the second magnetic field 600*b*. The second magnetic field 600*b* generated by the second magnetic field generator 640*b* may be the same, similar or different from the first magnetic field 601*a* generated by the first magnetic field generator 640*a*.

After obtaining the first obstructed signal data, each of the plurality of sensory elements depicted in FIG. 6 $S_{1,1}$ 620, $S_{2,1}$ 621, $S_{3,1}$ 622, $S_{4,1}$ 623, $S_{5,1}$ 624 and $S_{N,1}$ 628 will then measure the second magnetic field 601*b* at each position in association with the magnetic permeable body 8 and then each sensor reading will be converted to a digital format, as ferrobody sensor data 26 which will then be stored within the storage media and then transmitted to the processor 52 for processing along with the ferrobody sensor data 26 associated with the first magnetic field generator 640*a*. A digital model of the magnetic permeable body 8 will be generated by processing the ferrobody sensor data 26 in comparison to the threshold data 25, providing a measurement of the magnetic permeability of the magnetic permeable body 8 adjusted based on the threshold signal data. The digital model may also be used to generate a visual image which can be displayed using the visual display 56.

Additional magnetic field generators may be utilized using the same or similar process as described above or as depicted in FIG. 3 with the first magnetic field generator 240, second magnetic field generator 241, third magnetic field generator 242 and fourth magnetic field generator 243 being sequentially energized and deenergized with a reading being obtained at each of the sensory elements which as illustrated in FIG. 3 extends from $S_{1,1}$ to $S_{N,N}$ in an N×N array embodiment of sensors in response to each of the energized magnetic field generators 240, 241, 242, 243.

Figure 5:
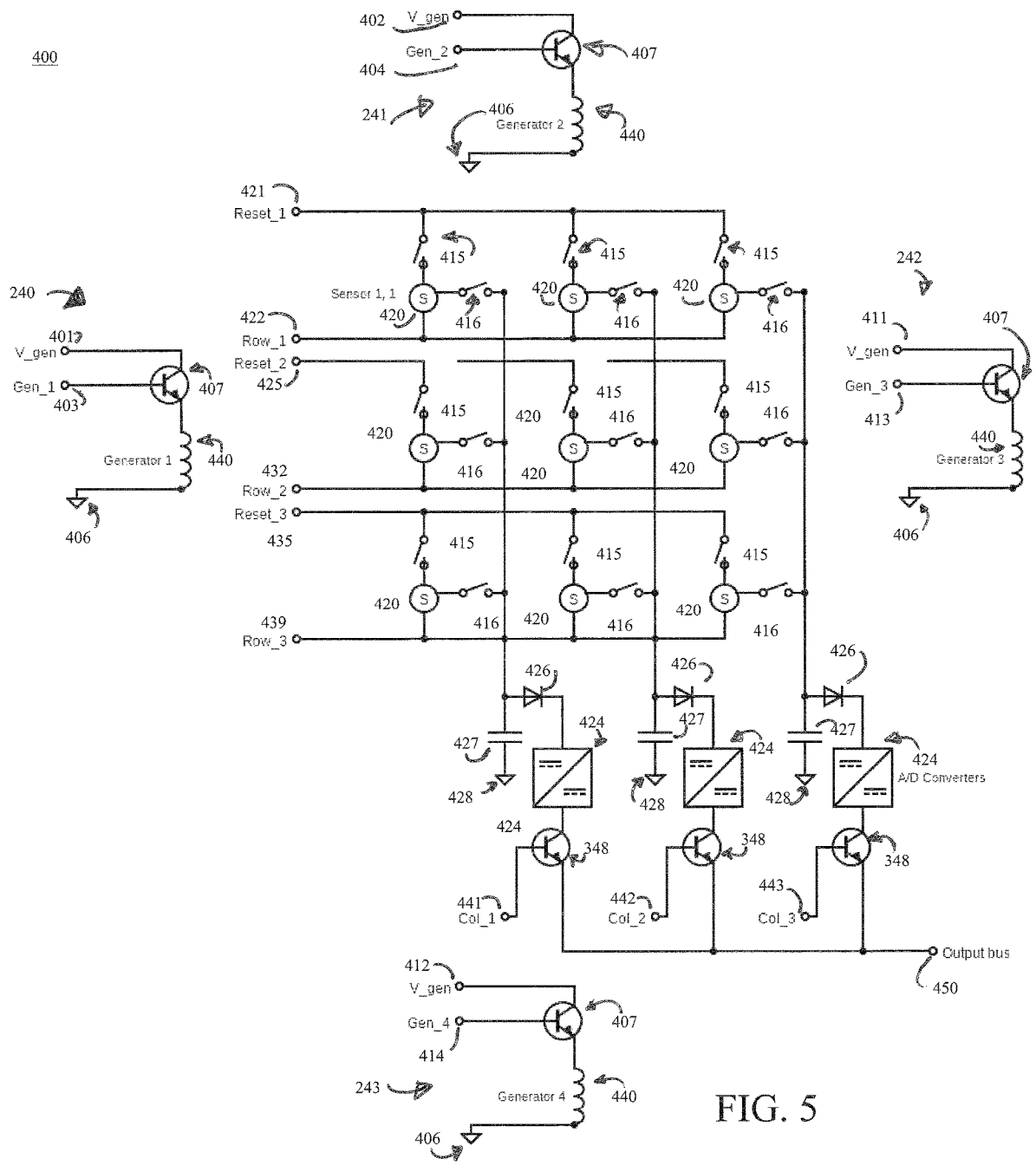
FIG. 5 is a schematic circuit diagram for an embodiment of the converter for processing the sensor data into permeability data for mapping the magnetic permeability body with a plurality of sensor circuits, each including a pair of switches.

FIG. 5 is an exemplary circuit schematic 400 depicting a 3×3 sensory array matrix 405 surrounded by four magnetic field generators 440 in accordance with one embodiment of the system. Generally, the circuit schematic 400 demonstrates the operation of the magnetic field generators 440 operating independently at fixed locations in operational communication with the 3×3 sensor array matrix 405 with nine sensory elements 420. In general, each sensory element 420 in the sensory array matrix 405 is connected to an AD converter 424 for measuring the generated magnetic field 600. Each magnetic field generator 440 is depicted as an inductor coil and is connected to reset transistor 407 which operates as a switch and includes an input 403, 404, 413, 414 and a ground connection 406. Referring to the sensory array matrix 405, a plurality of sensor reset switches 415 allow each sensor element 420 to toggle on and off allowing the sensor element 420 to measure the output of each magnetic field generator 440 independently. Each sensor element 420 generally includes the necessary electrical components associated with sensing the magnetic field 600 such as the magnetic circuit 300 depicted in FIG. 4. As depicted in FIG. 5, each row of sensor elements 420 is connected to a row output 422, 432, 439 and a row reset 421, 422, 432. The row output 422, 432, 439 enables the sensor element 420 to transmit its analog data by closing the row select switch 416 on the right side. In one embodiment, only data associated with one row of sensory elements is configured for transmission at a time to allow accurate reading of the data. When energized, reset input Reset_1 421, Reset_2 425, Reset_3 435 will close to reset switch 415, will reset the sensory element 420 to an initial state to ensure consistent measurements. Each column of sensory elements 420 within the sensory array matrix 405 is connected to one A/D converter 424. The output of each A/D converter 424 will be connected to the column selector switch 416 at the output of the sensory element 420 for communication with the column bus transistor 348. Column bus transistor 348 allows for sensor data 23 to be transmitted through A/D converter 424 onto output bus 450.

The exemplary circuit schematic 400 includes the 3×3 sensor array matrix 405 with the series of rows and columns which are responsive to magnetic flux densities. For each row in the sensor array matrix 405, various row select circuitry including the row selector switch 415, sensory element 420, row output 422 and reset input 421 are connected to each of the sensor elements 420 in the first row for selective receipt of sensor data 23 representing the magnetic flux density sensed by the sensor elements 420. For each column in the sensory array structure matrix 405, various column select circuitry including a column selector switch 416 sensory element 420, diode 426, capacitor 427, ground 428, A/D converter 424 are operationally connected to each of the sensor elements 420 in each column for selective receipt of sensor data 23 at the output bus 450 for selective receipt of the output signals representing the magnetic flux sensed by the sensor elements 420.

In the embodiment of a circuit schematic illustrated FIG. 5, magnetic field generators 40 are placed around the 2-D sensor array 20. In the illustrated embodiment, the magnetic field generators 40 can operate independently at fixed locations surrounding the sensor array 20.

It is to be understood that while certain forms of the present invention have been illustrated and described herein, it is not to be limited to the specific forms or arrangement of parts described herein. Other arrangements or embodiments, changes and modifications not precisely set forth, which can be practiced under the teachings of the present invention are to be understood as being included within the scope of this invention as set forth in the claims below.

What is claimed and desired to be secured by Letters Patent:

1. A ferrobody magnetic permeability mapping system comprising:
   a first magnetic field generator;
   a second magnetic field generator in electrical communication with said first magnetic generator;
   a circuit controller in operational communication with each of said first and said second magnetic field generators whereby each of said first and said second magnetic field generators is configured to generate a three-dimensional blended field of magnetic potential;
   said circuit controller stabilizing at least one of said first and said second magnetic field generators;
   a sensor array for generating magnetic flux data,
   said sensory array spaced opposite at least one of said first and second magnetic field generators and in communication with a processor and further comprising at least a first sensor element in electrical communication with a second sensor element;
   a ferrobody material positioned within said three-dimensional field of magnetic potential and presenting a corresponding flux density in an offset orientation between said first magnetic field generator and said second magnetic field generator;
   said sensory array providing sensor data associated with the magnetic permeability of said ferrobody material;
   said first sensor element associated with a first position;
   said second sensor element associated with a second position spaced from said first position whereby said sensory array provides sensor data associated with the magnetic permeability at each of said first and said second position;
   said sensor array comprising at least one row select circuitry wherein said sensor data includes positional data associated with each of said first position and said second position;
   said processor processing said sensor data obtained from said row select circuitry associated with said ferrobody material.

2. The ferrobody magnetic permeability mapping system of claim 1 wherein said processor generates a three-dimensional model of said ferrobody material based on said sensory data obtained from said row select circuitry.

3. The ferrobody magnetic permeability mapping system of claim 1 wherein said magnetic permeability sensor further comprises column select circuitry wherein said magnetic permeability of said ferrobody material is selectively obtained by said row select circuitry and said column select circuitry.

4. A ferrobody magnetic permeability mapping system comprising:
   a first magnetic field generator in electrical communication with a second magnetic field generator;
   a ferrobody material spaced from said first and said second magnetic field generator;
   a sensor array spaced opposite and in communication with at least one of said first magnetic field generator and said second magnetic field generator and further comprising at least a first sensor element in electrical communication with a second sensor element, wherein said first sensor element and said second sensor element provide positional data associated with the magnetic permeability of said ferrobody material at a first and a second position;
   a circuit controller in operational communication with said first magnetic field generator, said second magnetic field generator and said sensor array; and
   said sensor array comprising at least one row select circuitry wherein said sensor data includes positional data associated with each of said first position and said second position.

5. A process for determining the magnetic permeability of a ferrobody material said process comprising the steps of:
   positioning at least a first magnetic field generator and a second magnetic field generator in electrical communication with a circuit controller;
   positioning a sensor array with at least a first sensor element and a second sensor element opposite said first and second magnetic field generator;
   stabilizing at least one of said first and second magnetic field generators;
   activation of said first magnetic field generator and said second magnetic field generator to obtain threshold data from said sensory array;
   positioning said ferrobody material between said first and said second magnetic field generator;
   activation of said first magnetic field generator and said second magnetic field generator to obtain ferrobody sensor data from said sensory array; and
   determining the magnetic permeability of said ferrobody material by processing said threshold sensor data and ferrobody sensory data at a processor.

* * * * *